United States Patent [19]
Russell et al.

[11] Patent Number: 5,990,193
[45] Date of Patent: *Nov. 23, 1999

[54] POLYMERS FOR REVERSIBLE PHOTOINDUCED SOL GEL TRANSITIONS

[75] Inventors: Alan J. Russell, Wexford; Eric J. Beckman, Edgewood; Fotios M. Andreopoulos; William R. Wagner, both of Pittsburgh, all of Pa.

[73] Assignee: University of Pittsburgh, Pittsburgh, Pa.

[ * ] Notice: This patent issued on a continued prosecution application filed under 37 CFR 1.53(d), and is subject to the twenty year patent term provisions of 35 U.S.C. 154(a)(2).

[21] Appl. No.: 08/571,250

[22] Filed: Dec. 12, 1995

[51] Int. Cl.$^6$ .................................................... C08J 3/24
[52] U.S. Cl. ......................... 522/149; 522/162; 522/178; 522/183; 526/320
[58] Field of Search ..................... 522/149, 162, 522/173, 181, 183; 430/286.1, 287.1; 526/320

[56] References Cited

U.S. PATENT DOCUMENTS

| | | |
|---|---|---|
| 3,257,664 | 6/1966 | Leubner et al. ..................... 430/287.1 |
| 3,761,280 | 9/1973 | Wolff et al. ......................... 522/149 X |
| 3,933,885 | 1/1976 | Satomura ............................ 522/149 X |
| 4,065,430 | 12/1977 | Satomura ......................... 430/287.1 X |

FOREIGN PATENT DOCUMENTS 58-69208  4/1983  Japan ..................................... 522/149

OTHER PUBLICATIONS

English Translation of Nakanishi et al., JP 53–69208, Apr. 1983.

*Primary Examiner*—Bernard Codd
*Attorney, Agent, or Firm*—Bartony & Hare

[57] ABSTRACT

The present invention provides crosslinked polymeric networks that are reversibly crosslinked upon exposure to light of a suitable wavelength. In one embodiment photocrosslinkable branched hydrophilic polymers containing photochromic groups are synthesized. Cinnamylidene groups and derivatives of cinnamylidene are preferably used as the photochromic agents or photocrosslinking agents.

16 Claims, 15 Drawing Sheets

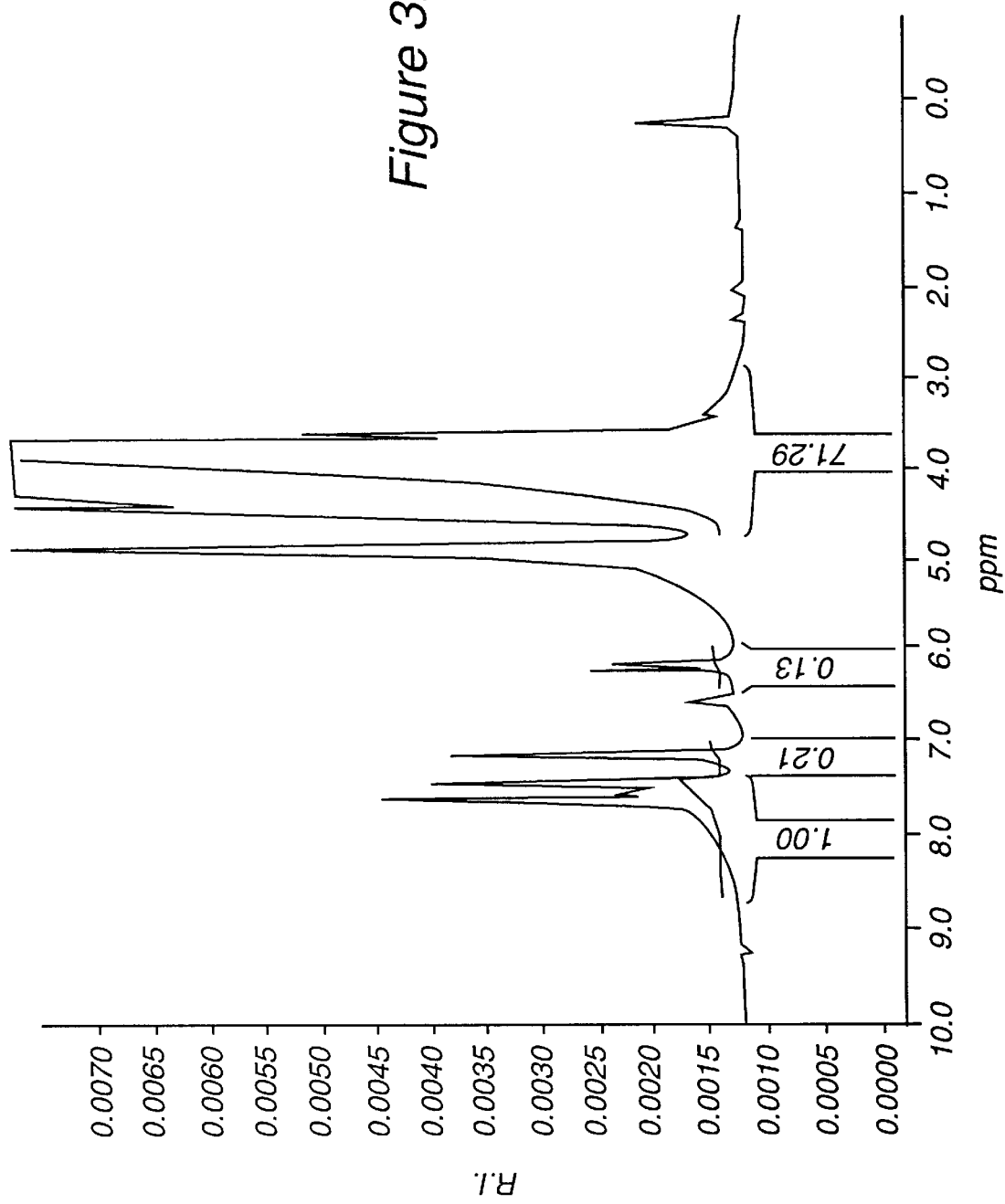

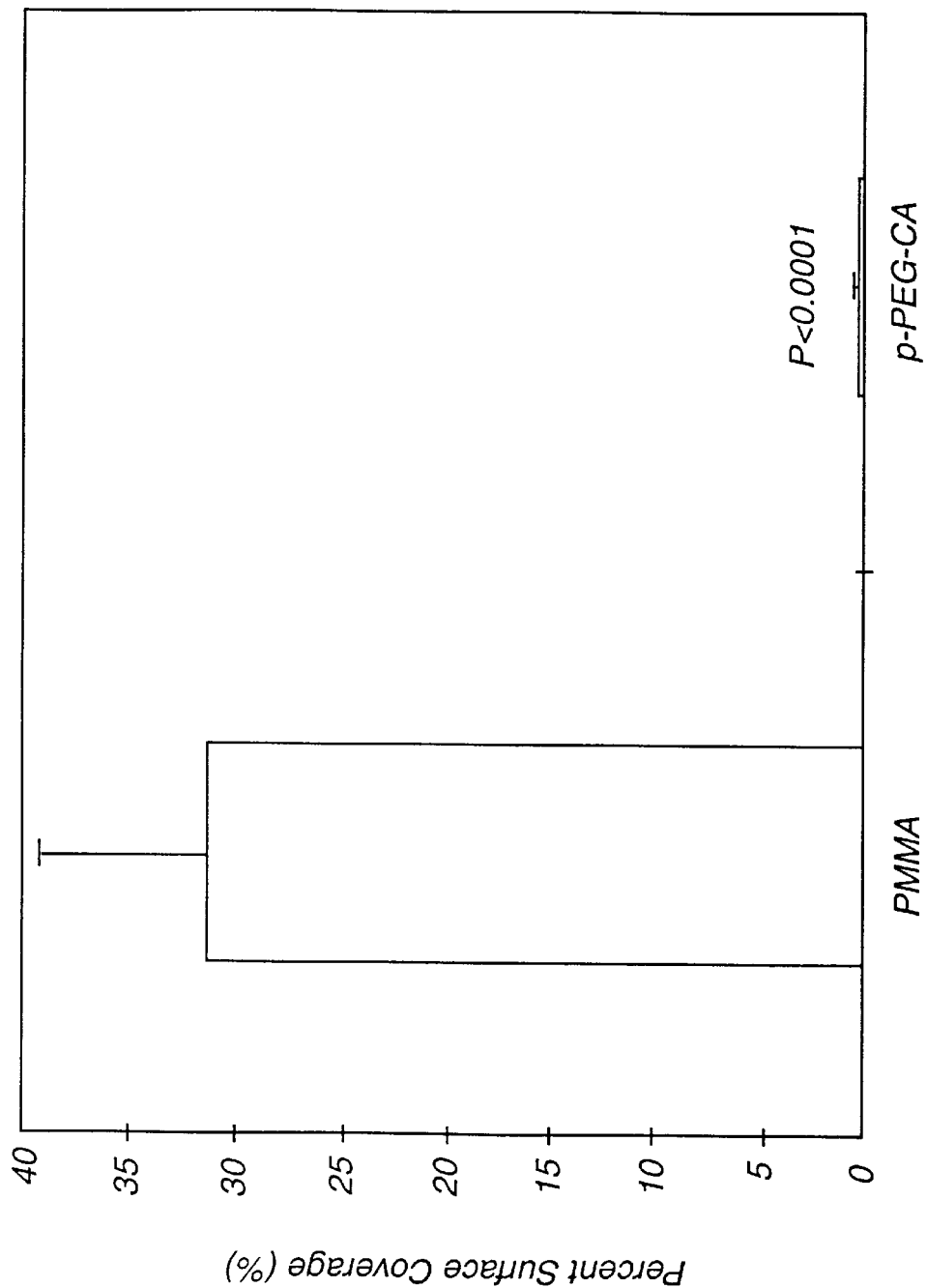

POLYMERS FOR REVERSIBLE PHOTOINDUCED SOL GEL TRANSITIONS

FIELD OF THE INVENTION

The present invention relates to photoreversible polymeric networks and, particularly, to polymers capable of undergoing photoinduced sol gel transitions.

BACKGROUND OF THE INVENTION

Polymeric networks formed through the action of UV/visible radiation are generally constructed via a free-radical reaction initiated by small-molecule photosensitive activators. These networks can be based on either crosslinkable, preformed polymers or by reactions of monomers with di- and tri-functional crosslinking agents. Crosslinked polymeric networks are found in a wide variety of industrial and medical uses.

Recently, there has been significant interest in synthesizing crosslinked hydrophilic polymers for various biological uses. Hydrogels (that is, crosslinked hydrophilic polymers) generally, because of their characteristic properties such as swellability in water, hydrophilicity, biocompatibility and lack of toxicity, have been utilized in a wide range of biological and medical applications. The anti-thrombogenic and biocompatibility properties of poly(ethylene glycol) (PEG), for example, have been extensively studied and are well established. In the case of existing PEG-based networks, the crosslinkable groups are traditionally acrylate or methacrylate groups, which readily polymerize in the presence of 365 nm radiation and the appropriate activators. The carbon-carbon bonds formed during the cross-linking reaction are relatively permanent, depolymerizing only at elevated temperatures which would likely destroy the entire material. In a number of applications, however, it would be beneficial to develop reversibly cross-linked hydrogels.

Although conventional chemical crosslinking has been extensively used as a hydrogel preparation method, relatively little work has been reported on the preparation of hydrogels via photopolymerization of water soluble polymers. Current photoinduced systems for hydrogel preparation include: (i) free radical polymerization initiated by long wave ultraviolet light or visible light of acrylate groups attached to water soluble polymers, and (ii) photopolymerization of photosensitive groups such as cinnamate, stilbazolium or coumarin which are pendant to the end of hydrophilic polymers. Although such work has demonstrated photopolymerization, there has been no demonstration of a truly photoreversible system. Indeed, only very limited photoreversibility has been observed.

In that regard, at least one study has reported a photopolymerized system comprising a water soluble polymer having a cinnamate pendant group, but the extent of photoreversibility of that system, as observed by UV spectroscopy, was less than 25% (as measured by the change of the absorbance at 275 nm). In addition, the time of irradiation that was required to detect such reversible behavior was quite long (that is, on the order of 2 to 3 hours). Likewise, coumarin groups have been reported to produce photocrosslinked polymer systems based on polyoxazolines. A 55% conversion of the photoinduced dimer to the starting material has been reported for such polyoxazoline-based systems. The conversion was calculated from the UV absorbance spectrum after irradiation of the polyoxazoline gel with a low-pressure Hg lamp. The time of irradiation of the polyoxazoline-based systems was quite long, however. Moreover, only the photoreversible behavior of the polyoxazoline-based systems after a single cycle of irradiation was investigated.

It is very desirable to develop efficient photoreversible hydrogel systems. Indeed, it is very desirable to develop efficient photoreversible polymeric crosslinked systems generally (including hydrophobic systems).

SUMMARY OF THE INVENTION

Accordingly, the present invention provides crosslinked polymeric networks that are reversibly crosslinked upon exposure to light of a suitable wavelength. In one embodiment photocrosslinkable "branched," "starburst" or other "tree-like" polymers containing photochromic groups are synthesized.

Preferably, photochromic groups for use in the present invention have relatively high quantum efficiency for photocrosslinking. Such photochromic groups also preferably exhibit a relatively high degree of photoreversibility. Cinnamylidene groups, for example, have similar chemistry to cinnamate groups, but have much higher quantum efficiency for photocrosslinking. Moreover, the crosslink between cinnamylidene groups of the present polymer systems has been found to be photoreversible in that the crosslink between two such groups forms upon exposure to one wavelength of energy and reverts to the original two groups upon exposure to a different wavelength of energy. To the contrary, cinnamate groups exhibit relatively low degree of photoreversibility. See *Photographic Sci. Eng.*, 15:60 (1971).

Cinnamylidene groups and derivatives of cinnamylidene (for example, a cyano derivative) are thus preferably used as the photochromic agents or photocrosslinking agents. In general, any photochromic cinnamylidene derivative or moiety can be used, including, but not limited to the following: cinnamylidene acetyl chloride, α-methylcinnamylidene acetyl chloride, α,γ-dimethylcinnamylidene acetyl chloride, α-phenylcinnamylidene acetyl chloride, α-phenoxycinnamylidene acetyl chloride, and cyanocinnamylidene acetyl chloride.

Generally the present invention provides a photosensitive polymer network synthesized from branched macromeric precursors. To create a crosslinked network, the branched macromeric precursors are preferably functionalized with at least three photochromic moieties. Functionalization, with less than three photochromic moieties results in a termination point. As set forth above, these photochromic moieties are preferably cinnamylidene moieties.

The double bonds of such cinnamylidene moieties undergo intermolecular cross-linking via a 2+2 cycloaddition upon exposure thereof to light of a known range of wavelengths (that is, wavelengths in excess of approximately 300 nm) to from the photosensitive polymer network. The photosensitive polymer networks formed in this manner are capable of undergoing a reversible photoscission upon exposure thereof to light of a second known range of wavelengths. The photoscission reaction occurs upon exposure of the photosensitive polymer network to light having a wavelength less than 300 nm. Such light is preferably in the range of approximately 244 nm to approximately 264 nm.

Preferably, the branched macromeric precursors used in the present invention have a molecular weight of at least approximately 400. Given the ease of functionalization of a specific macromeric precursor with a suitable photochromic crosslinking group, virtually any macromeric precursor can be used in synthesizing the present photoreversible polymeric networks. By way of example only, such macromeric precursors include poly(ethylene oxides), polyoxylates, polycarbonates, polyurethanes and polyacrylates. The branched macromeric precursors are also preferably functionalized with multiple photochromic moieties (for example, cinnamylidene moieties) such that the resultant functionalized precursor comprises no more than approximately 10 mol % of the photochromic moiety. More preferably, the branched macromeric precursors are functionalized with multiple photochromic moieties such that the resultant functionalized precursor comprises no more than approximately 5 mol % of the photochromic moiety. The content of the photochromic moiety in the functionalized precursor is preferably maintained relatively low such that the bulk properties of the precursor are not significantly affected by the functionalization. It has been discovered that in this manner, photoreversible polymeric networks having a wide range of physiochemical characteristics can be synthesized.

In a preferred embodiment, hydrophilic branched macromeric precursors are used to synthesize a photoreversible hydrogel. Examples of such hydrophilic macromeric precursors include, but are not limited to, one or more of the following: poly(ethylene glycol) (PEG), poly(vinyl alcohol) (PVA), poly(propylene glycol) (PPG), and polyurethanes. Preferably the hydrophilic branched macromeric precursors are based on PEG.

As used in connection with the present invention, the term photoreversible refers generally to the capability to undergo a photoscission of preferably at least 20% of the photochromic intermolecular crosslinks of the present polymer networks. More preferably, at least 40% of the intermolecular crosslinks undergo photoscission. Even more preferably, at least 60% of the intermolecular cross-links undergo photoscission. Most preferably, at least 80% of the intermolecular cross-links undergo photoscission.

Preferably, the desired degree of photoscission occurs relatively rapidly. In that regard, the desired degree of photoscission is preferably achieved in less than approximately 2 hours. More preferably, the desired degree of photoscission is achieved in less than approximately 1 hour. Most preferably, the desired degree of photoscission is achieved in less than approximately 0.5 hour.

The photoreversible behavior hydrogel systems under the present invention (in water) is quite superior to known photoreversible systems. Indeed, a minimum of 51% (as determined by UV) photoreversibility of PEG systems under the present invention has been achieved upon irradiation of the solution polymer with a Xenon lamp (150 W) at 254 nm. In addition, the reverse reaction occurs at a much faster rate than that of known systems. Moreover, the use of a mercury lamp as a light source for initiating the reversible reaction of the present photoreversible hydrogels would improve both the extent and rate of the photoreversible reaction. In that regard, mercury lamps exhibit much higher light intensity at 254 nm than the Xenon lamp used in the present studies.

Photoreversible hydrogels under the present invention are suitable for a number of uses. For example, encapsulation of cells for generation of an artificial organ could be accomplished by slurring the cells with a liquid precursor, followed by a chemical or physical reaction which generates a biocompatible gel. While use of the precursor allows ease of processing, reaction to form a more solid construct provides the scaffolding on which the cells can grow and enough structural integrity to allow implantation. Formation of immunoisolative capsules around islets of Langerhans (to ultimately allow xenografts as a treatment for diabetes), for example, requires an initial liquid solution of precursor to form the capsules which then reacts to form a network. The final crosslinked system prevents physical degradation of the capsules after implantation.

Design of a "bandage" which promotes wound healing could also benefit from such an approach. Ideally, a liquid precursor is used which readily conforms to the irregular contours of the wound and subsequently reacts to form a rigid construct to remain in place as long as necessary. Indeed, polyethylene glycol has been shown to be one of the more biocompatible synthetic materials which one can choose to construct devices for use in contact with living tissue, and thus the present photocrosslinkable material could have numerous such applications in tissue-contact devices. As used herein, the term "biocompatible" refers generally to the capability of coexistence with living tissues of organisms without causing harm thereto.

Moreover, photo-reversibility allows for several other potential applications. For example, disposable diapers employ hydrogels (crosslinked, hydrophilic polymers) as the primary absorbents. These products cannot be recycled because of several factors, among which is the fact that once crosslinked, a polymer cannot be reprocessed without severe degradation. Consequently, use of an efficient reversible crosslinking agent could allow for design of a recyclable hydrogel material.

In general, any application which calls for a recyclable or removable crosslinked polymeric material would benefit from the present invention.

BRIEF DESCRIPTION OF THE DRAWINGS

FIG. 3B illustrates the $^1$HNMR spectrum of b-PEG in $D_2O$.

FIG. 9A illustrates a bar graph of percent platelet deposition on PMMA coverslips and on PMMA coverslips coated with b-PEG-CA hydrogel.

DETAILED DESCRIPTION OF THE INVENTION

In the present studies, polyethylene glycol was used as a model precursor in the synthesis of photoreversible polymer networks. "Four-armed" polyethylene glycol (b-PEG, MW=15,000) was purchased from Shearwater, Inc. Trans-Cinnamaldehyde (99%+), used for the synthesis of cinnamylidene acetic acid, was purchased from Aldrich Chemical Company of Saint Louis, Mo. Tetrahydrofuran (THF) (HPLC Grade), used as a solvent for the esterification reaction between cinnamylidene acetyl chloride and b-PEG, was purchased from Aldrich Chemical Company. All purchased solvents and reagents were used as purchased with no further purification.

Synthesis of Cinnamylidene Acetic Acid

Cinnamylidene acetic acid was synthesized according to the method described in U.S. Pat. No. 3,257,664, the disclosure of which is incorporated herein by reference. In general, 104 gms of malonic acid (Aldrich), 126 ml of trans-cinnamaldehyde and 90 ml of pyridine were mixed and exposed to slight heating for complete solubilization of the reaction mixture. Piperidine (0.25 ml) was then added, and the mixture was allowed to stand at room temperature for approximately 26 hours. The reaction mixture was then refluxed at 115° C. for 18 hours. When the reaction was completed, the reaction mixture was allowed to cool to room temperature. In turn, the solution was poured into cold dilute (5 w/v %) hydrochloric acid. The resulting yellowish solid cake was washed repeatedly with deionized water, and the wet product was crystallized from ethyl alcohol to give cinnamylidene acetic acid (65.22 gms). The purity of cinnamylidene acetic acid was determined by $^1$HNMR and UV spectroscopy. $^1$HNMR (CDCl$_3$-TMS): δ=6.1 ppm (d, 2H), δ=6.9 ppm (t, 2H), δ=7.5 ppm (m, 5H). The —COOH proton could not be detected in the NMR spectrum, but the product of the esterification reaction between cinnamylidene acetic chloride and polyethylene glycol established its existence. UV (in dichloromethane): $\lambda_{max}$=313 nm, ϵ=37,390 L$^3$mol$^-$1cm$^{-1}$, $\lambda_{max}$=250 nm, ϵ=1985 L$^3$mol$^{-1}$cm$^{-1}$.

Synthesis of Cinnamylidene Acetyl Chloride

Cinnamylidene acetyl chloride was prepared by stirring approximately 17.15 gms of cinnamylidene acetic acid with 30 ml thionyl chloride in 300 ml of petroleum ether for 12 hours at room temperature. The reaction mixture was then refluxed for 4 hours in an oil bath at a temperature of approximately 40 to 50° C. The excess thionyl chloride and the petroleum ether were removed under reduced pressure. $^1$HNMR: δ=6.2 ppm (d, 2H), δ=6.9 ppm (q, 2H), δ=7.5 ppm (m, 5H). UV (in dichloromethane): $\lambda_{max}$=333 nm, $\lambda_{min}$=256 nm.

Synthesis of the Photosensitive b-PEG-Cinnamylidene Acetate

Figure 1:
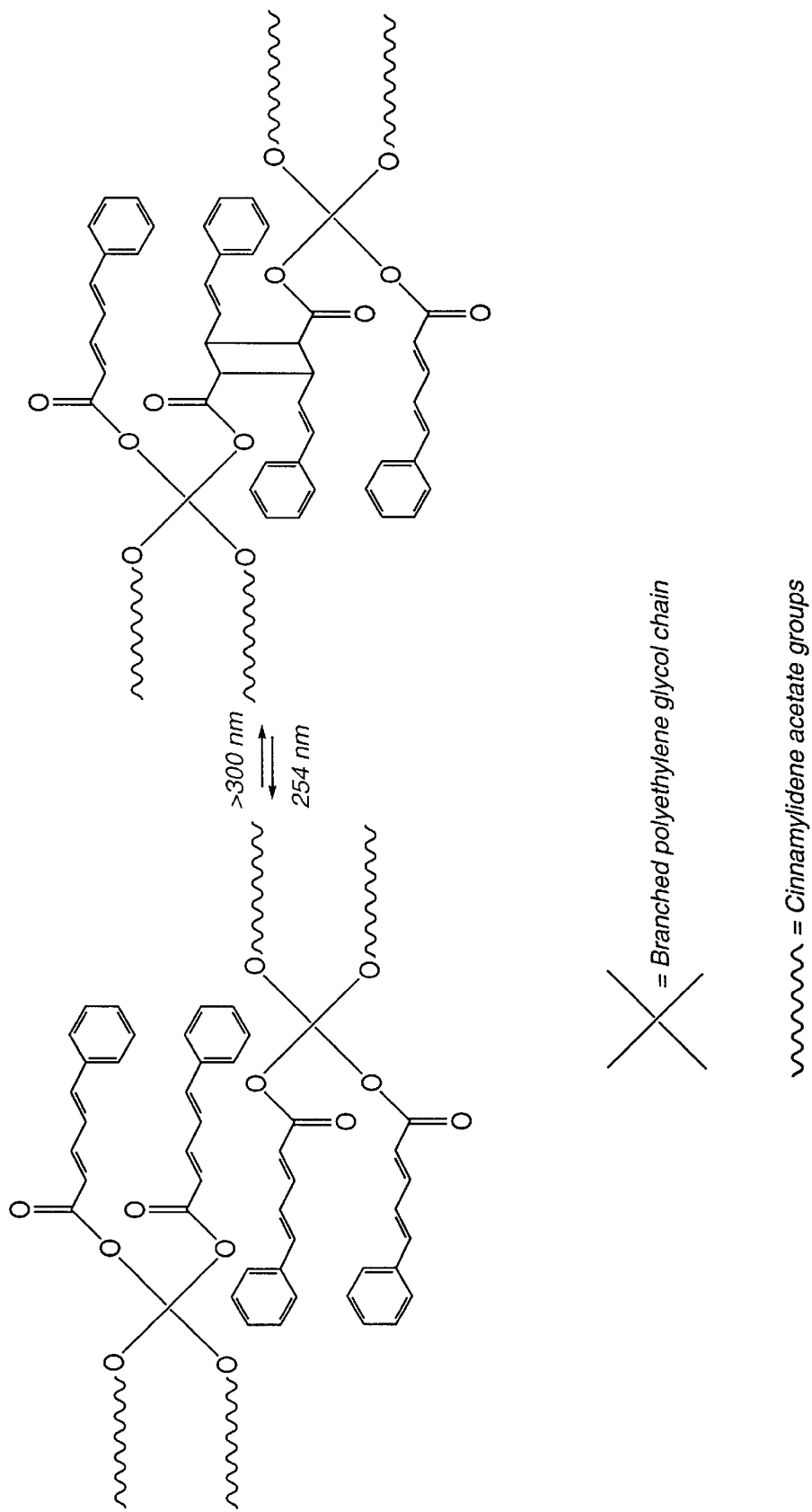
FIG. 1 illustrates the crosslinking reaction between four-armed PEG and cinnamylidene acetyl chloride.
Figure 2:
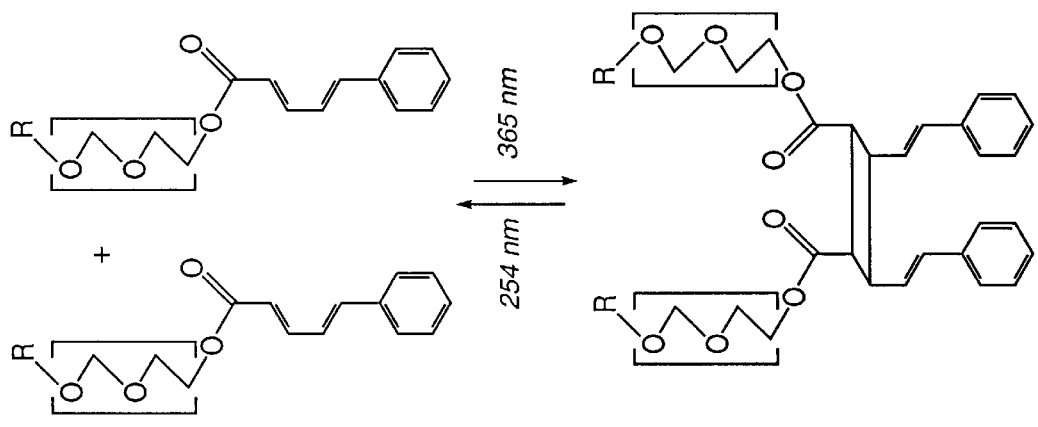
FIG. 2 illustrates the photopolymerization and photoscission reactions of four-armed polyethylene glycol-cinnamylidene acetate (b-PEG-CA) when irradiated with light of an appropriate wavelength.
Figure 3A:
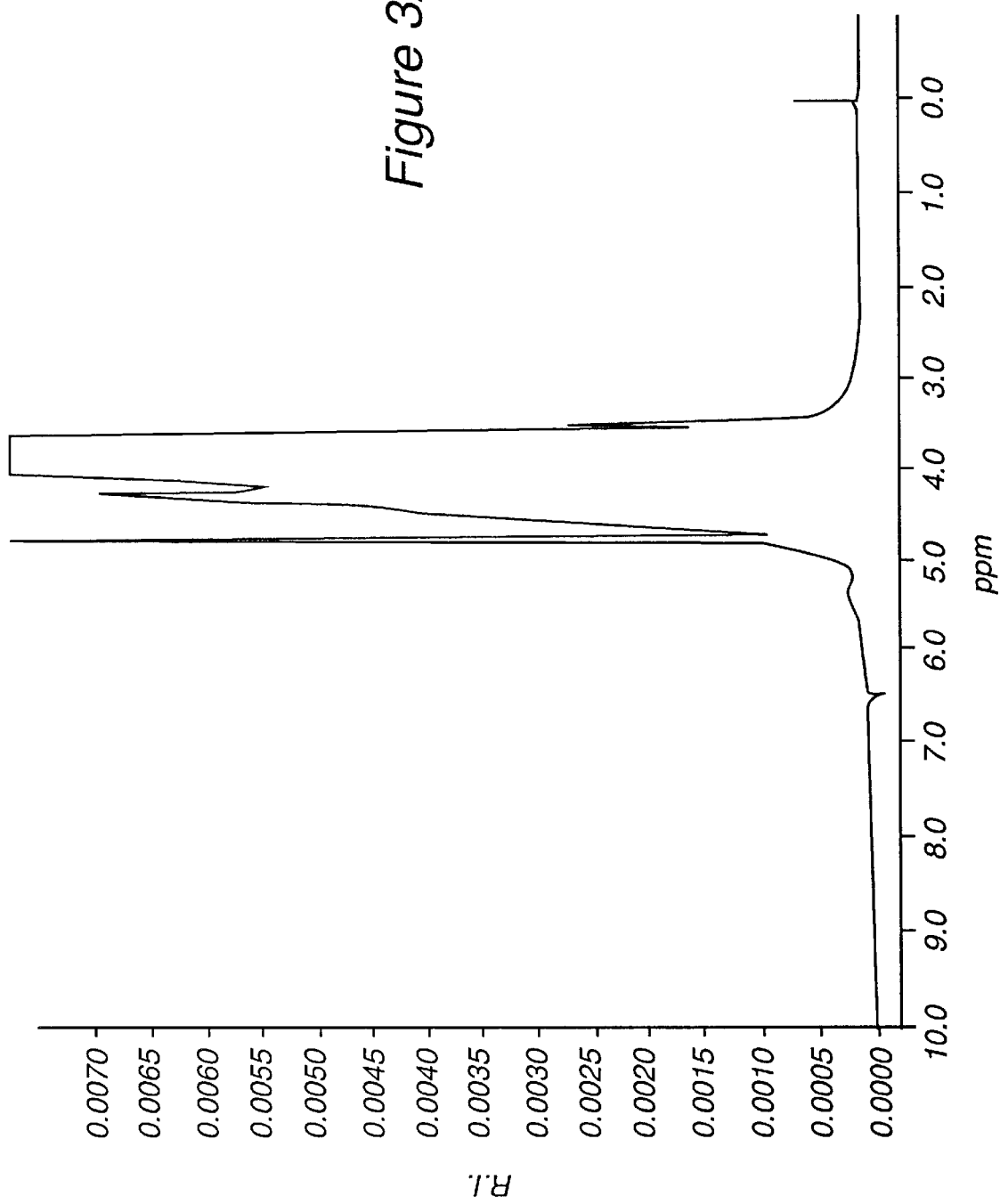
FIG. 3A illustrates a $^1$HNMR spectrum of b-PEG-cinnamylidene acetate (69% degree of substitution) in $D_2O$.

The photosensitive polymer was prepared by a crosslinking reaction between b-PEG (four-armed) and cinnamylidene acetyl chloride as illustrated schematically in FIG. 1. The photoreversible nature of the photopolymerization reaction is also illustrated schematically in FIG. 2. FIGS. 3A and 3B illustrate the $^1$HNMR spectra of b-PEG and cinnamylidene acetate-modified b-PEG (69% degree of substitution) in deuterium oxide (D$_2$O). The degree of substitution was 0.6575 mol % content of cinnamylidene acetate (CA) as determined by UV. The appearance of characteristic proton peaks at δ=7.5 ppm, δ=6.9 ppm and δ=6.1 ppm indicated the presence of the cinnamylidene acetyl moiety as a pendant group of the b-PEG molecule. The degree of substitution of photosensitive groups can also be calculated from the integral ratio between the cinnamylidene acetate and the polyethylene glycol (which appeared at δ=3.6 ppm). Both the UV method and the $^1$HNMR method of calculating the degree of substitution (or modification) of the b-PEG molecule provided similar results.

Figure 4:
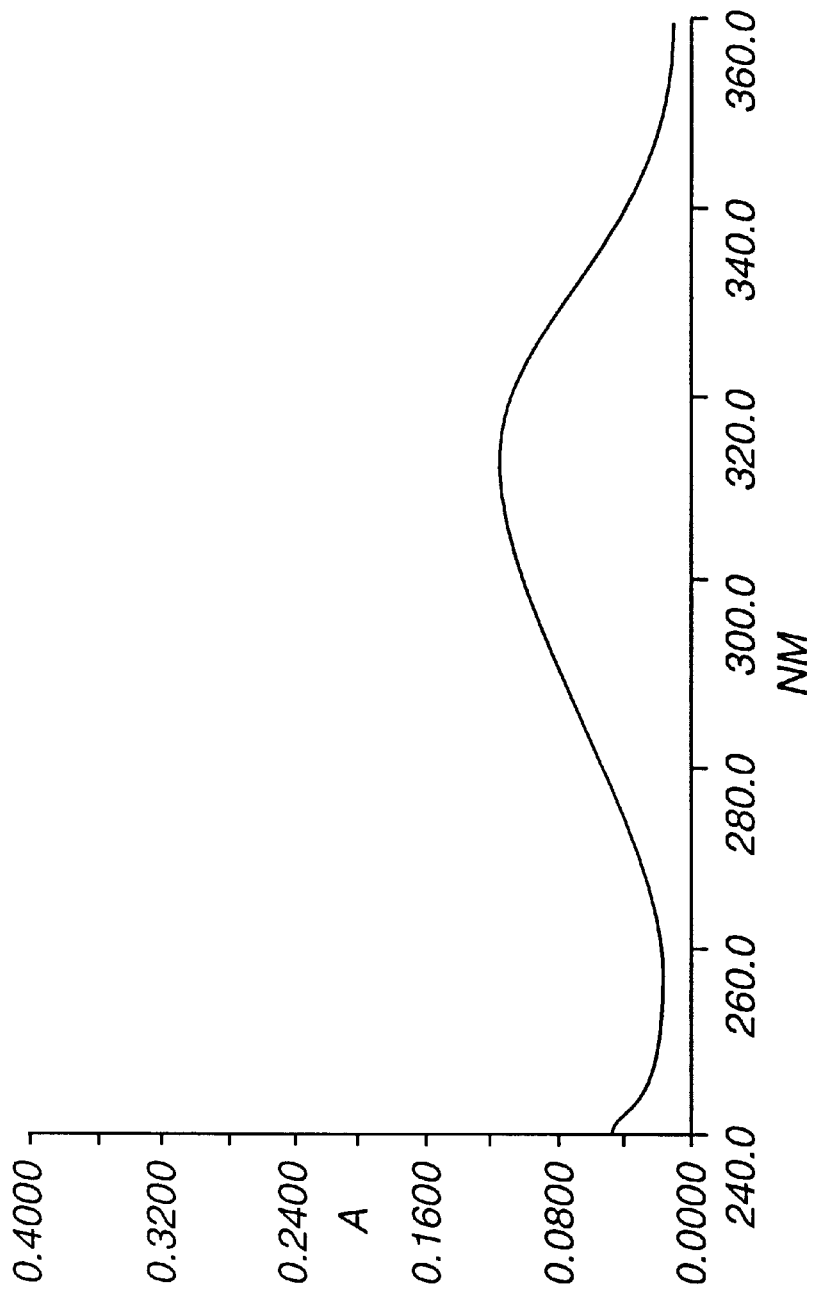
FIG. 4 illustrates the UV absorbance spectrum of b-PEG-cinnamylidene acetate.
Figure 5:
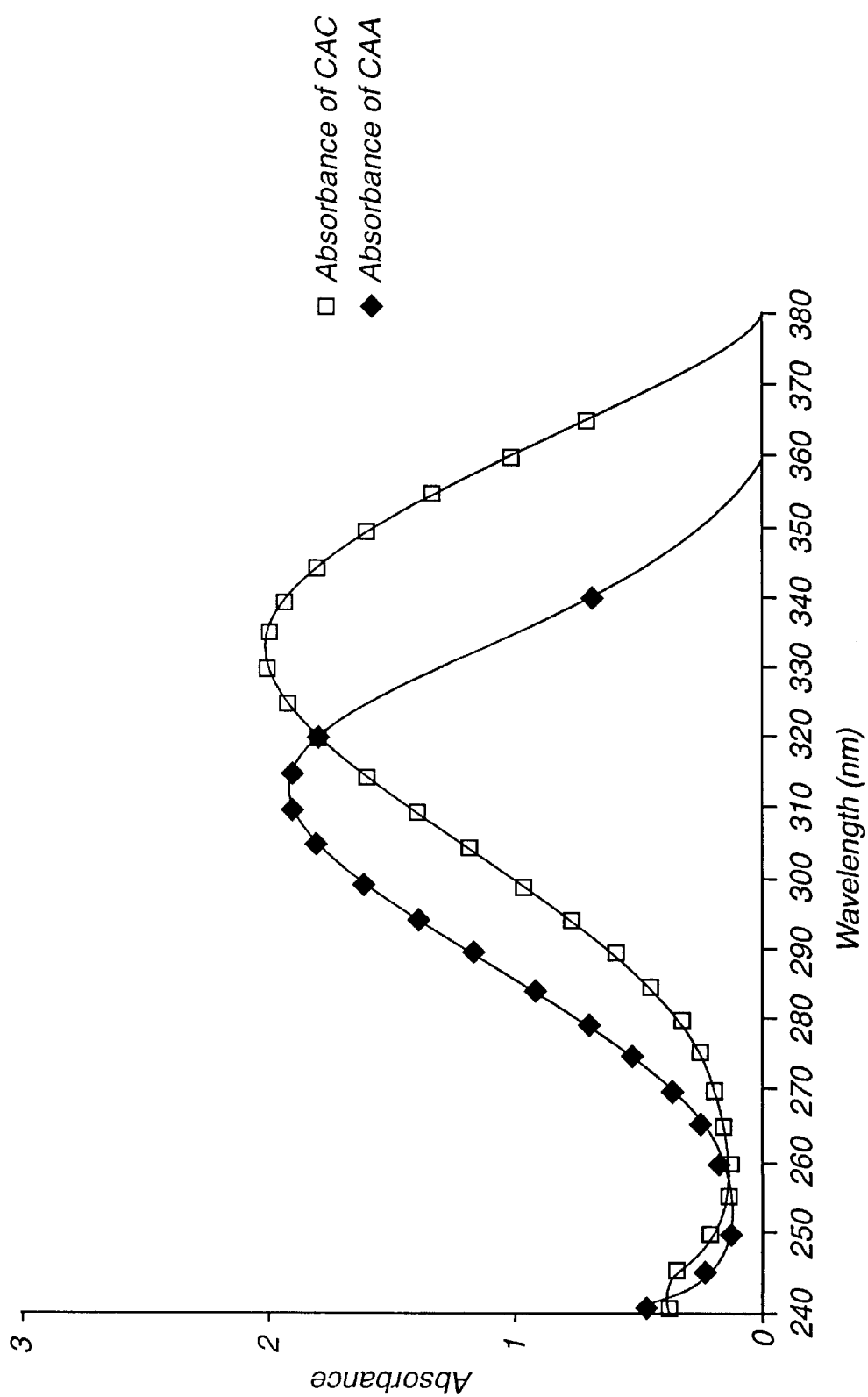
FIG. 5 illustrates the UV absorbance spectra of cinnamylidene acetic acid and cinnamylidene acetyl chloride in dichloromethane.

The UV spectrum of the b-PEG-cinnamylidene acetate (b-PEG-CA) (degree of substitution determined to be 69% by UV, 1.11×10$^{-6}$ moles/L) in dichloromethane is shown in FIG. 4. Unmodified b-PEG in dichloromethane shows no significant absorption from 240 nm to 360 nm. Therefore, the characteristic absorption peak of b-PEG-CA at 313 nm indicated the cinnamylidene acetate moiety. The UV absorption spectrum of the photosensitive b-PEG, resembles the UV spectrum of poly(vinyl cinnamylideneacetate) compounds which have been investigated and well characterized. See U.S. Pat. No. 3,767,415; Tanaka, H. et al., "Photoreversible Reactions of Polymers Containing Cinnamylidene Derivatives and the Model Compounds," J. Poly. Sci., 15:2685–2689 (1977); Tanaka, H. et al., "Photochemistry of Poly(vinyl cinnamylideneacetate) and Related Compounds," J. Poly. Sci., 10:1729–1743 (1972); Tanaka, H. et al., "Photosensitivity of Polyvinylesters of Substituted Cinnamylideneacetic Acids," J. Poly. Sci., 10:3279–3287 (1972); and Tanaka, H. et al., "Photoreversible Reactions of Poly(vinyl cinnamylideneacetate) and its Model Compound," J. Poly. Sci., 12:1125–1130 (1974). The UV absorption spectra of cinnamylidene acetic acid (CAA) and cinnamylidene acetyl chloride (CAC) are illustrated in FIG. 5. The absorption maximum and minimum wavelengths for CAC ($\lambda_{max}$=333 nm, $\lambda_{min}$=256 nm) are higher than the absorption maximum and minimum wavelengths for CAA ($\lambda_{max}$=313 nm, $\lambda_{min}$=251 nm). Since the absorption maximum and minimum wavelengths of the CAA were similar to those for the modified b-PEG, CAA was used as the model compound for the evaluation of the extinction coefficient of b-PEG-CA at its absorption maximum (ϵ=37,390 L$^3$mol$^-$1cm$^{-1}$). The degree of substitution in b-PEG-CA was then estimated from the UV spectrum of the photosensitive polymer by using the absorption extinction coefficient of the model compound.

Photogelation of Cinnamylidene Acetate-Modified b-PEG

Figure 6A:
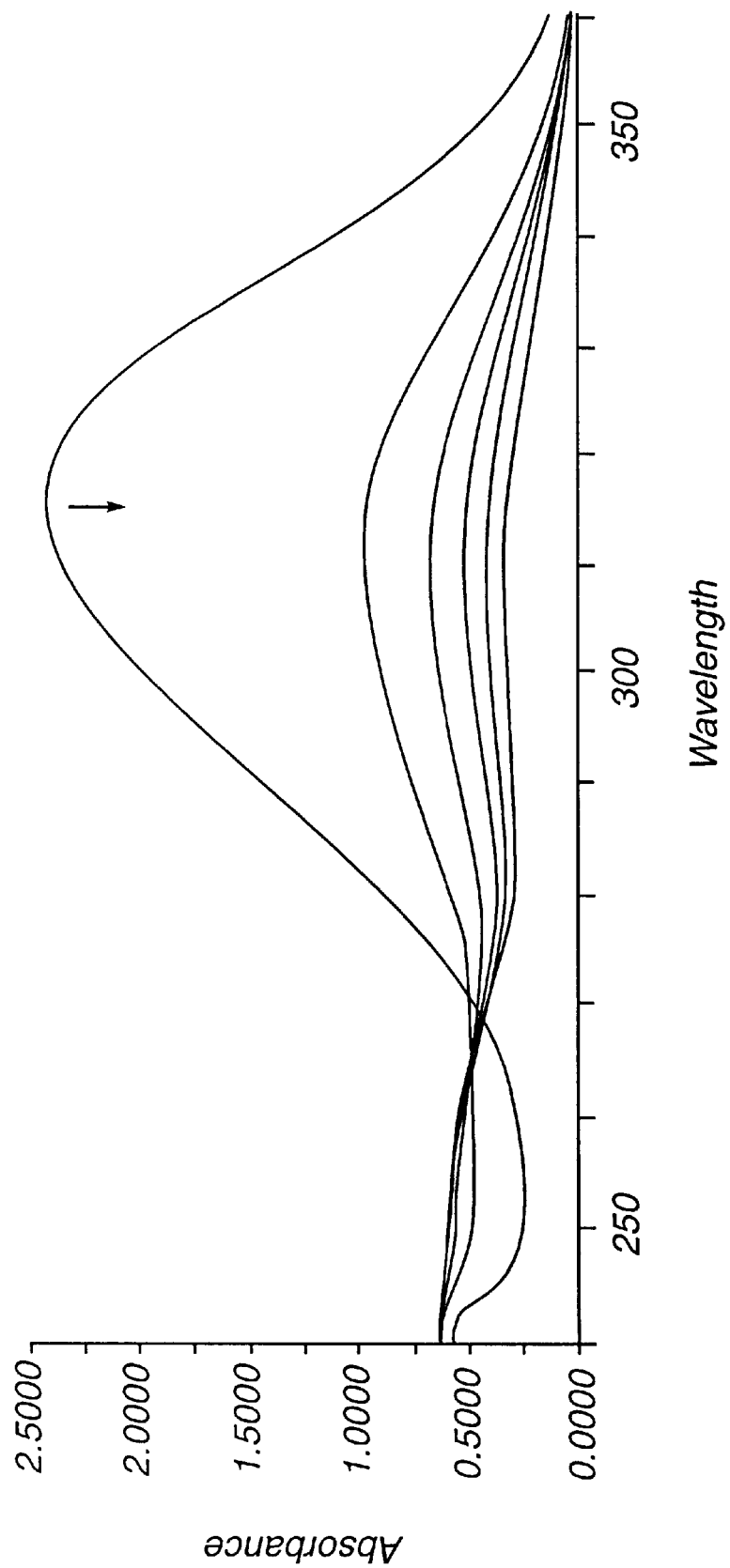
FIG. 6A illustrates the absorption spectrum for b-PEG-CA as a function of time when exposed to light at 313 nm.
Figure 6B:
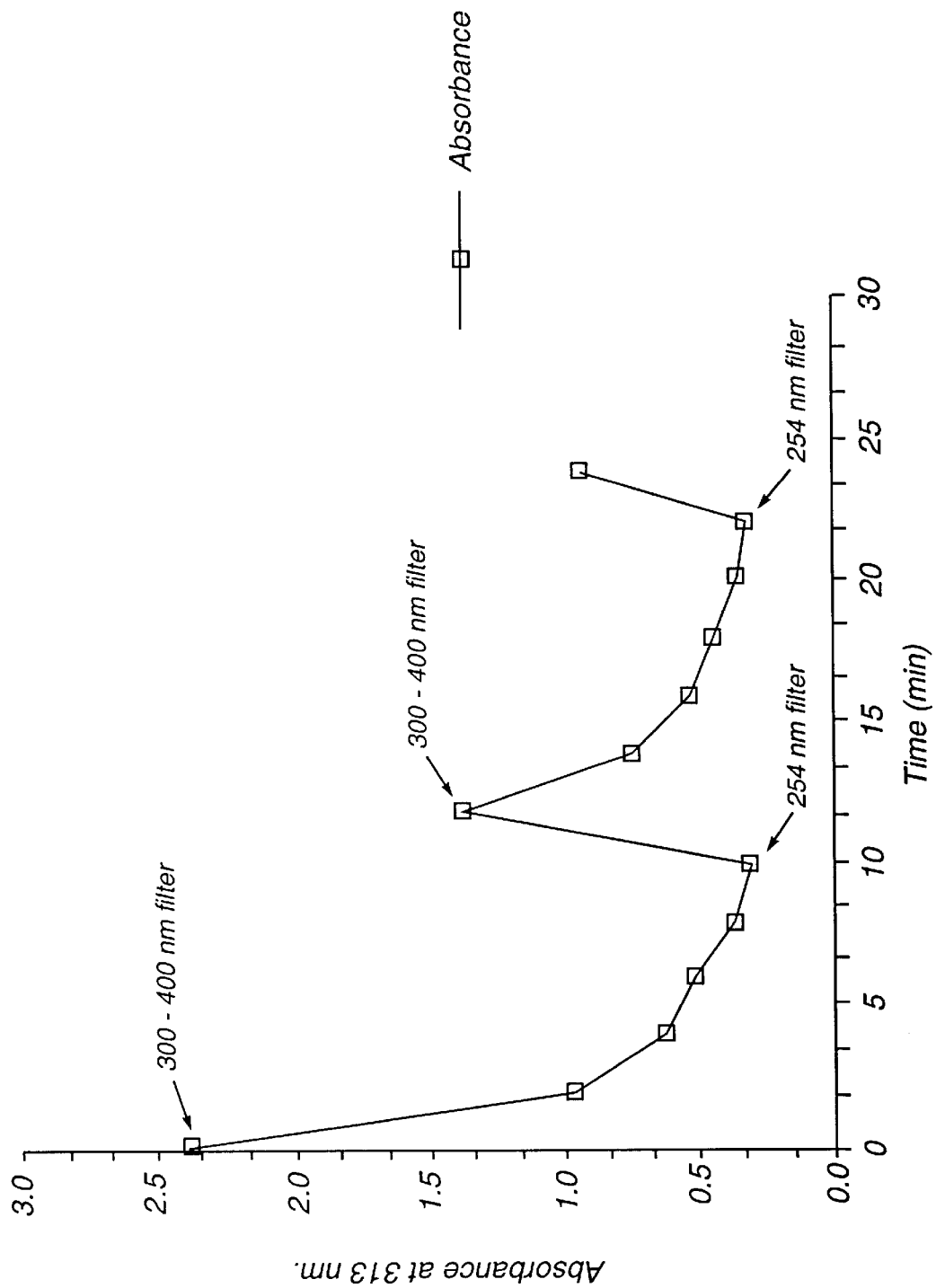
FIG. 6B illustrates two cycles of photopolymerization/photoscission reactions of b-PEG-cinnamylidene acetate as monitored by a UV spectrophotometer equipped with a 150 W Xenon lamp.

The photopolymerization of the cinnamylidene acetate polyethylene glycol, as illustrated in FIG. 1, was performed in a bulk film cast from dichloromethane solution on a cover slip. A 450 W medium pressure Hg lamp at λ>300 nm was used as the UV light source. The reaction was monitored by studying the change in absorption at $\lambda_{max}$=313 nm of the modified b-PEG dissolved in deionized water. A TV spectrophotometer equipped with a 150 W Xenon lamp was used to measure the absorbance changes. FIG. 6A illustrates the absorption spectrum for b-PEG-CA as a function of time when exposed to light at 313 nm. The spectral change is an indirect measurement of the disappearance of the double bond adjacent to the carbonyl group of the cinnamylidene acetate moiety and, at the same time, the formation of a cyclobutane ring. As discussed above, cinnamylidene acetyl moiety undergoes a 2+2 cycloaddition reaction. Specifically, when trans-cinnamylidene acetyl moiety is exposed to light, it transforms to a cis-cinnamylidene acetyl group which subsequently undergoes photopolymerization via cyclobutane ring formation. As shown in FIG. 6B, 87% of the photoreaction is complete in less than 10 minutes (without use of a photoinitiator), as determined by the changes in the absorbance of the photosensitive polymer at 313 nm.

Figure 7:
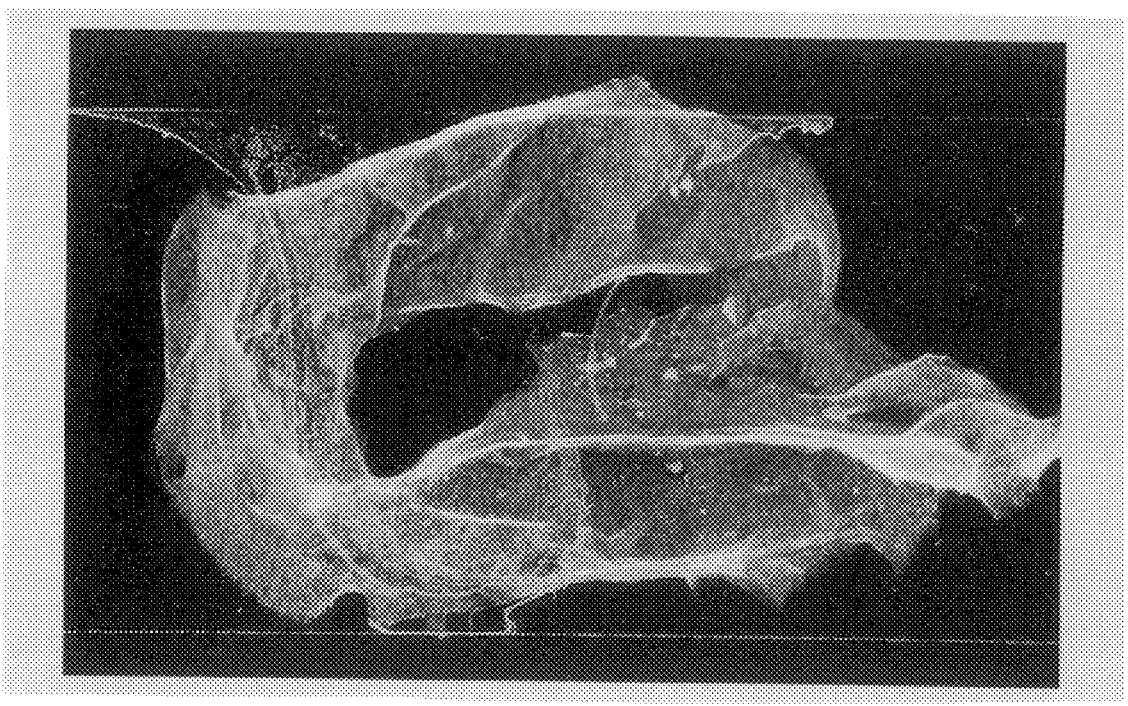
FIG. 7 illustrates a dry b-PEG-CA hydrogel (69% modification).
Figure 8:
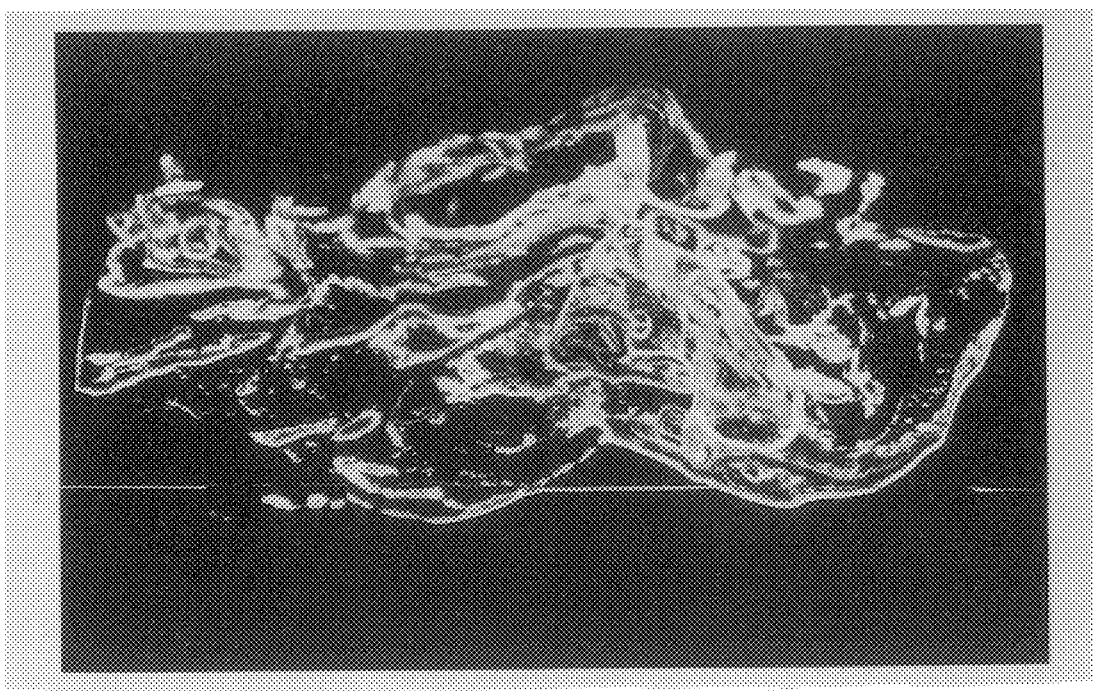
FIG. 8 illustrates the hydrogel of FIG. 7 after swelling in water for 10 minutes.

Photogelation of photosensitive PEG's cast on glass slides occurred as fast as approximately 10 minutes. The gel point was defined as the point at which b-PEG-CA monomers formed an insoluble three dimensional structure in water upon irradiation with UV light. FIG. 7 illustrates a dry b-PEG-CA (69% modification) hydrogel resulting after irradiating for 2 hours, washing with deionized water, and drying in vacuum for 6 hours. FIG. 8 illustrates the same hydrogel after swelling in water for 10 minutes. Further irradiation gave more rigid gels with reduced swellability. In the presence of erythrosin, photosensitive PEG molecules cast on cover slips reach gel point in less than 20 minutes. Specifically, gel formation was observed after 15 minutes of irradiation (under the same conditions set forth above) when a solution of b-PEG-CA (0.0084 M) in water was mixed with 2 drops of erythrosin solution (0.056 M) in water and cast over a glass slide. The light source was a 450 W Hg lamp. No gelation occurred in the absence of the cinnamylidene acetyl group within the polymer chain (that is, in the case of a non-modified b-PEG). A mixture of equal amounts of cinnamylidene acetic acid and unmodified b-PEG was suspended in deionized water and irradiated with the 450 W UV lamp for more than 3 hours, but no gelation was observed. These results indicate that the intermolecular crosslinking by 2+2 cycloaddition reaction of the double bonds of the cinnamylidene acetate moieties in the modified b-PEG caused the formation of stable gels.

Swelling Properties in Water

The degree of swelling in water is a function of the degree of modification of the PEG molecule and the duration of UV exposure. As the degree of substitution of the hydroxel groups of the PEG molecule (with the photosensitive group) increased, the resulting gels became more rigid, and the amount of water such gels absorbed decreased. Preferably, a degree of swelling in the range approximately 2 to 100 is obtained in a hydrogel system.

To study the effect of the degree of modification upon swelling properties, samples of photosensitive b-PEG with a variant degree of modification were cast on glass slips from a dichloromethane solution. The polymer films were irradiated with a 450 W medium pressure Hg lamp for 1 hour and their degree of swelling was determined. After irradiation, the polymer films were washed with deionized water to remove any unreacted polymer and then dried at room temperature, under air for 2 days. The dried gels were weighed and then soaked in deionized water for 24 hours. The swollen gels were removed from solution, dried of any excess of fluid with a tissue, and weighed. The degree of swelling was determined using the equation $(\text{Weight}_{wet} - \text{Weight}_{dry})/\text{Weight}_{dry}$. In this equation, $\text{Weight}_{wet}$ refers to the weight of the swollen gel, while $\text{Weight}_{dry}$ refers to the weight of the dried gel. Table 1 shows the change in the degree of swelling of prepared photosensitive polymers as the degree of modification is altered.

TABLE 1

| Number of Experiments | Mol % Content of CA% | Degree of Subs. (avg.) of PEG's Hydroxyl Groups | Weight of Dry Gel (mg) | Weight of Swollen Gel (mg) | Degree of Swelling |
|---|---|---|---|---|---|
| 1 | 0 | 0 | no gelation | N/A | N/A |
| 4 | 0.6575 | 25% | .775 ± .125 | 46.25 ± 9.95 | 58 ± 4 |
| 4 | 1.68 | 64% | 3.425 ± 1.47 | 121.05 ± 39.8 | 35 ± 5 |

As set forth above, as the time of irradiation increased, the resultant gels became more rigid and their retention of water decreased. In Table 2 below, the degree of swelling of the PEG gels (69% degree of substitution) is shown as a function of irradiation time for a 5-hour period. Although the degree of swelling decreases with increasing duration of irradiation, even after 5 hours of irradiation, the PEG gels can still retain a large amount of water (that is, a water uptake of 13 times the gel's original weight). The degrees of swelling that have been reported in this study, appear to be much higher than those of gels that have been synthesized by photopolymerization of water soluble polymers having different photocrosslinkable moieties as pendant groups, such as coumarin and cinnamate groups, under the same irradiation conditions.

TABLE 2

| Time (hours) | Degree of Swelling | Number of Experiments |
|---|---|---|
| 1 | >16 | 1 |
| 2 | 16 ± 1 | 3 |
| 3 | 14 ± 1 | 3 |
| 4 | 13 ± 1 | 3 |

Photoreversible reaction

Prior to the present invention, merely a few photoinduced hydrogel systems have exhibited only a very limited degree of reversibility. The photoreversibility of b-PEG-CA was monitored by studying the change of its UV absorption (69% degree of functionalization) in water at 313 nm. FIG. 6B illustrates two full cycles of the photoreversibility that b-PEG-CA in water exhibits when exposed to UV light of a proper wavelength. For the first 10 minutes of irradiation (the forward, photopolymerization reaction), the absorbance peak at 313 nm decreased from 2.375 to 0.3 (an 87% decrease). At the end of the 10th minute, the 300–400 nm bandwidth filter was replaced by a 254±10 nm filter and the reverse, photoscission reaction was observed during the next 4 minutes. During that time, the absorbance peak at 313 nm increased from 0.3 to 1.35 (a 51% increase). Subsequently, the 254 nm filter was replaced with the 300–400 nm filter and the forward reaction was once again studied. The absorbance peak at 313 nm decreased from 1.35 to 0.3 (a 77.7% decrease) during the next 10 minutes of light exposure. Finally, the 254 nm bandwidth filter was once again placed in front of the light source and the photoreversible reaction was studied. The absorbance at 313 nm increased from 0.3 to 0.9 in the final 4 minutes of irradiation (a 29% increase).

During the first cycle of photopolymerization-photoscission reaction, a "reversibility" of 51% was observed for the polymer system as determined by the changes in absorbance at $\lambda=313$ nm. In the second cycle of the photoreaction, a recovery of nearly 30% of absorbance was observed. The extent of photoreversibility can, however, only be estimated since a mixture of cis and trans photocleaved b-PEG-CA molecules are likely to have been produced from the irradiation at 254 nm. Because the extinction coefficient of the cis-b-PEG-CA molecules is less than the extinction coefficient of the corresponding trans molecules, a lower absorbance was observed and, consequently, a smaller extent of photoreversibility of the b-PEG-CA hydrogels was calculated. In other words, the present method for calculating the extent of photoreversibility inherently underestimates the extent of photoreversibility and thus provides a minimum value. Visual observations of the "de-geletion" of the present hydrogels confirmed substantial photoreversibility.

The photoscission of the photopolymerized b-PEG-CA molecules in water appears to be a much faster reaction than the forward photopolymerization reaction. The highest absorbance change during the photoscission reaction is achieved within the first 4 minutes of light exposure at 254 nm. After 4 minutes of irradiation, only a slight decrease of the absorbance of the b-PEG-CA is observed. This observance may be a result of either: (i) some photodecomposition at the higher energy, shorter wavelength light, or (ii) leakage of the 254 nm bandwidth filter, which would result in some photopolymerization effect on uncrosslinked b-PEG-CA molecules.

The effect of a photosensitizer (Erythrosin) on the photoreaction was also investigated. Erythrosin is a photosensitizer which absorbs strongly between 400 and 500 nm. When b-PEG-CA solution was mixed with erythrosin and irradiated with a 150 W Xenon lamp, the mixture followed the same photochemical behavior at 313 nm as found in the absence of the photosensitizer. It is believed that in the presence of appropriate photosensitizers, hydrogels under the present invention can be photosynthesized via irradiation with visible light.

Biocompatibility of the b-PEG-CA Hydrogels

Figure 9B:
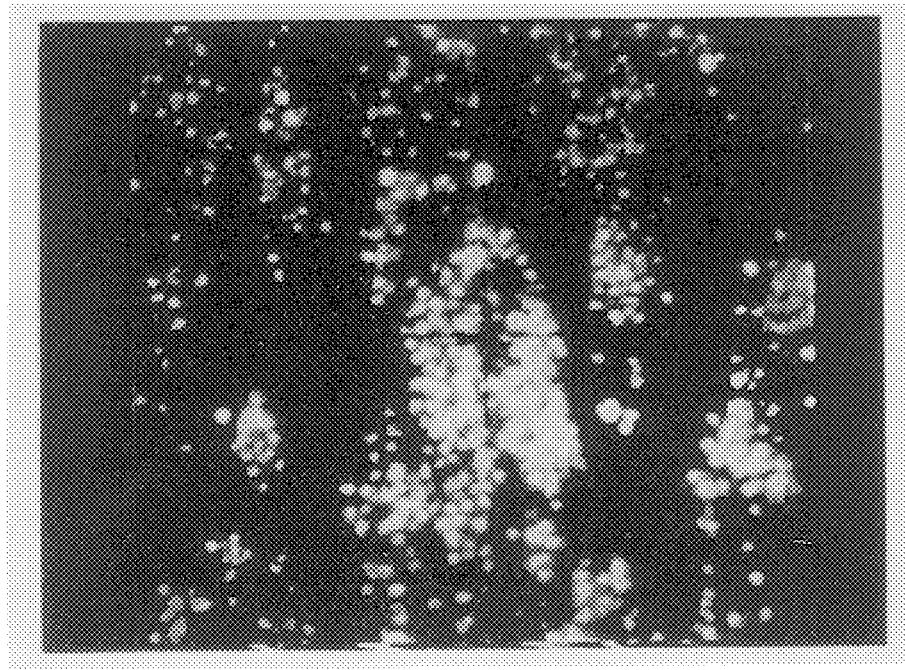
FIG. 9B illustrates an image of platelet deposition on a PMMA coverslip after 7 minutes of perfusion.
Figure 9C:
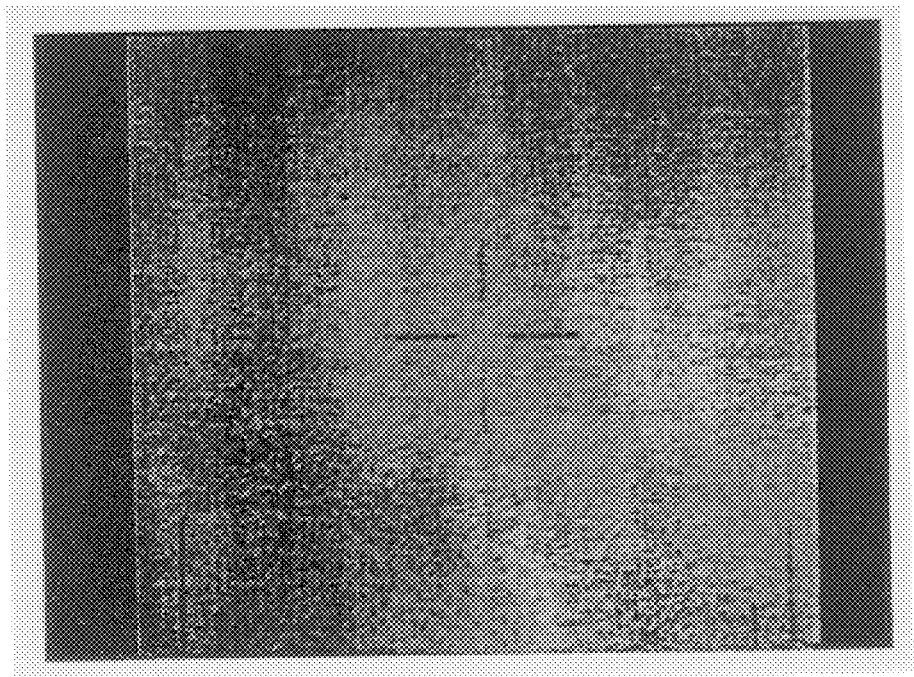
FIG. 9C illustrates an image of platelet deposition on a PMMA coverslip coated with b-PEG-CA hydrogel after 7 minutes of perfusion.

The results of blood perfusion studies are illustrated in FIGS. 9A through 9C. In FIG. 9A, the data are expressed as percent of surface area covered by platelets. In these studies, two polymethylmethacrylate (PMMA) slides and two b-PEG-CA coated PMMA slides were perfused and quantified. As illustrated in FIG. 9A, there was a highly significant (p<0.001) difference between the b-PEG-CA treated slides and the PMMA slides. This difference is illustrated graphically in FIGS. 9B and 9C. The b-PEG CA coating was thus found to be very effective in preventing platelet deposition. This result indicates that the photocrosslinking of the branched PEG under the present invention preserves the known blood biocompatibility properties of the polyethylene glycol molecule precursor.

Hydrogel Stability

Hydrogels prepared from 1.68 mol % CA content and 0.6575 mol % CA content, respectively, were stored at room temperature over a 2 month period. All of the samples retained their hydrophilic nature and water swellability, indicating that the intermolecular cross-linking by a 2+2 cycloaddition reaction of the cinnamylidene acetyl groups were strong enough to maintain the hydrogel structures intact for long periods of time.

Entrapment of Fluorescein Isothiocyanate Dextran in PEG-CA Hydrogel and Subsequent "De-gelation"

The use of a hydrogel synthesized under the present invention to encapsulate a Dextran was also studied. b-PEG-CA hydrogel fixed with Dextran-FITC was subjected to photoscission by irradiation with UV light from a 45 W Hg lamp at 254 nm. The PEG gel before irradiation appeared quite stable, with a light reddish color resulting from the Dextran's dye. The degree of swelling of the hydrogel was determined to be approximately 20. The hydrogel was then subjected to UV light at 254 nm for 20 minutes. The "de-gelation" of the PEG hydrogel was measured by determining the release of Dextran into a fixed volume of deionized water via fluorescence spectroscopy. Table 3 sets forth the intensity of fluorescence at 520 nm of the water solution resulting from the release of Dextran out of the hydrogel matrix as a function of irradiation time. As the irradiation time at 254 nm was increased the intensity of fluorescence in the water solution increased, indicating that Dextran was diffusing out of the hydrogel at a faster rate because of reduced crosslink density caused by photoirradiation at 254 nm. The results after 20 minutes indicate approximately 80% reversion. After 30 minutes of exposure at 254 nm, the hydrogel lost most of its integrity and appeared loose and colorless.

TABLE 3

| Time (minutes) | Intensity of Fluorescence at 520 nm |
| --- | --- |
| 0 | 160.34 |
| 10 | 310.78 |
| 20 | 558.30 |

The following examples detail the experimental conditions used in a number of typical studies under the present invention.

EXAMPLE 1

Synthesis of Branched PEG-Cinnamylidene Acetate

A typical procedure for the synthesis of photosensitive PEG is described below. Typically, 1.5 gms of b-PEG (four-armed, MW=15,000) were placed in a 250 ml, three-necked reaction vial and were dissolved in 80 ml of THF (HPLC grade). Some heating was required (T=40 to 50° C.) for complete solubilization of the b-PEG in the solvent. When the temperature of the reaction mixture returned to room temperature, the reactor was purged with 99+% $N_2$ gas for approximately fifteen minutes. Approximately 1.65 gms of cinnamylidene acetyl chloride which had previously been dissolved in 10 ml of THF were then transferred dropwise through a septum into the reaction vial. The reaction mixture was stirred continuously in the dark for approximately 17 hours at room temperature. Finally, the mixture was refluxed for 6 hours at 45 to 50° C. The resulting product was isolated by first removing the solvent by vacuum distillation, then precipitating the product three times in diethyl ether and finally, washing the product three times with acetone to remove any unreacted cinnamylidene acetyl chloride (CAC). Approximately, 1.05 gms of the modified PEG were collected (70% yield) and the product was placed in a vacuum oven to dry overnight at room temperature. $^1$HNMR (CDCL$_3$-TMS): $\delta$=3.5 ppm (t, 1362H), $\delta$=6.1 ppm (d, 8H), $\delta$=6.9 ppm (q, 8H), $\delta$=7.5 ppm (m, 20H). UV (in dichloromethane): $\lambda_{max}$=313 nm ($\epsilon$=37,390 L$^3$mol$^{-1}$cm$^{-1}$), $\lambda_{min}$=254 nm.

EXAMPLE 2

Photocrosslinking

In a typical experiment, cinnamylidene acetate modified PEG was dissolved in dichloromethane and then cast over a glass slide at room temperature under air. The resulting photocrosslinkable modified PEG was irradiated with a 450 watt medium pressure UV lamp (Hanovia). The lamp was placed in a water-jacket well, approximately 15 cm above the coated slide, and the polymer film was irradiated over a period in the range of approximately 15 minutes to 3 hours. A Pyrex filter was used to eliminate the wavelengths below 300 nm. After irradiation was completed, the film was washed with deionized water to remove any unreacted polymer and then was dried in vacuo. The yield of gelation was dependent on the time of irradiation.

EXAMPLE 3

Determination of Swelling Properties

In a typical experiment, the equilibrium swelling properties of the photocrosslinkable gel in deionized water were measured by dissolving 72.5 mg of b-PEG-CA in 0.4 mL of deionized water from which a film was cast in a cover slip as described above. After 2.5 hours of irradiation with a 450 W UV lamp, the resulting polymer was carefully dried and weighed. The resulting gel was immersed in 50 mL of deionized water for 6 hours at room temperature. The weight of the wet gel was determined to be 644.6 mg after excess water was carefully removed with a tissue. The Degree of Swelling was calculated as follows: (Weight$_{wet}$–Weight$_{dry}$)/Weight$_{dry}$.

EXAMPLE 4

Figure 11:
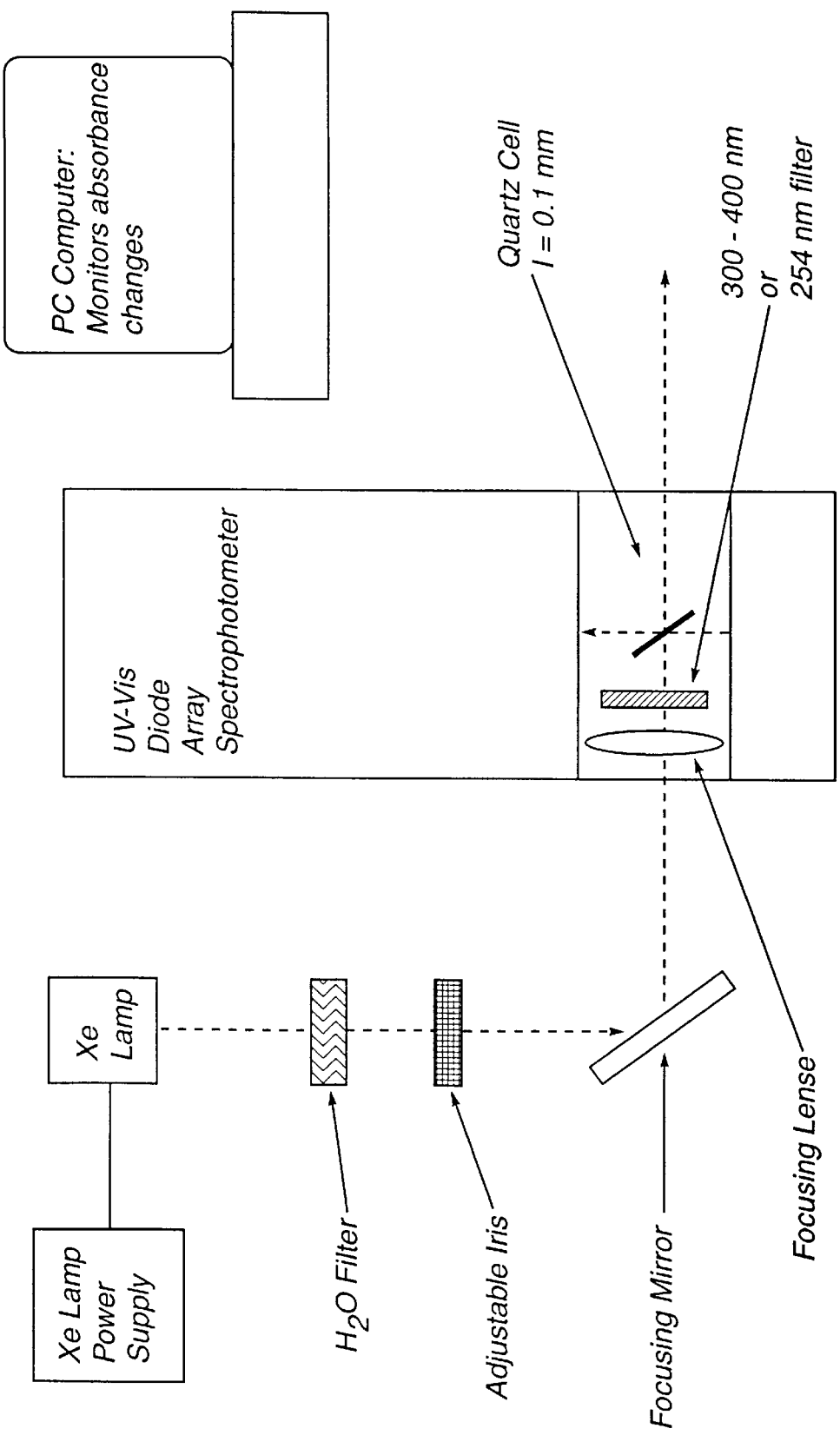
FIG. 11 illustrates a schematic representation of a UV photolytic system used in the present studies.

Photoreversibility of the Photosensitive PEG (a) The photoreversibility of the PEG-cinnamylidene acetate crosslinking was monitored using a UV spectrophotometer equipped with a 150 W Xenon lamp. A diagram of the apparatus is illustrated in FIG. 11. A small drop of a 22.5 w/v % solution of b-PEG-CA in deionized water was placed between two quartz plates (0.1 mm cell thickness), and the photopolymerization reaction was monitored for 10 minutes in 2-minute increments using a bandwidth filter to eliminate wavelengths below 300 nm. At the 10th minute, the filter was replaced with a 254 nm bandwidth filter (Andover) and the photocleavage reaction was monitored for the following 6 minutes. At the end of the sixth minute, the original 300–400 nm bandwidth filter was placed in front of the UV source and the forward reaction (photopolymerization) was observed once again for the next 10 minutes. Finally, the 254 nm bandwidth filter was placed in front of the UV light source and the reverse reaction was studied for 4 minutes. Photoinduced changes in the UV absorption spectrum of b-PEG-CA's UV were measured between 240 nm to 360 nm.

(b) Fluorescein-Isothiocyanate Dextran (Sigma) (0.04 h, MW=145,000) was mixed with a 1 mL solution of b-PEG-CA (0.157 g) in water, and the solution poured into a pyrex dish. The polymer solution was irradiated with a 450 W Hg lamp for approximately 2.5 hours. The resulting photo-crosslinked polymer was washed with deionized water to remove any uncrosslinked polymer and air-dried for two days. The dry gel was allowed to equilibrate in 40 ml of water for 26 hours. A small piece of the purified gel was irradiated with a 450 W lamp at 254 nm in increments of 10 minutes. Following each irradiation, the gel was placed in 10 ml of fresh deionized water and allowed to equilibrate for 30 minutes. The water solutions after each irradiation were collected, and the Dextran released from the gel matrix was measured by fluorescence spectroscopy at λ=520 nm. A Perkin Elmer Luminescence Spectrometer LS50B equipped with a Xenon lamp was used for the fluorescence measurements.

EXAMPLE 5

Calculation of Degree of Substitution (a) The mol % of substitution was calculated as follows. The general formula for PEG is HO—(CH$_2$CH$_2$)$_x$—OH Given a molecular weight of 15,000 for the PEG macromolecular precursor, there are approximately 340.5 such repeat units per macromolecule. As there are four hydrogen protons per repeat unit, there are approximately 1362 such protons in a macromolecular precursor having a molecular weight of 15,000. The number of hydrogen protons per attached cinnamylidene acetate moiety is 9. For 100% attachment of cinnamylidene acetate moiety, the total number of hydrogen protons corresponding to the cinnamylidene acetate moiety is 36. The degree of modification for 100% attachment is calculated via the following equation:

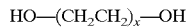

$$\frac{\text{mole of CA}}{\text{mole of PEG}} = \frac{36}{1362} = 2.6 \text{ mol \% CA}$$

(b) Using the calibration curve for cinnamylidene acetic acid in dichloromethane at 313 nm, the degree of substitution of PEG was also determined. According to the Baer-Lambert Law absorbance (A) is calculated according to the following formula: A=ε·b·c, wherein ε is the extinction coefficient, b is the cell thickness (1 cm in the present case), and c is the concentration. The extinction coefficient determined for the model compound, cinnamylidene acetic acid, was 37,390 L$^3$cm$^{-1}$mol$^{-1}$. By dissolving a sample in dichloromethane (at a known concentration), one can determine the degree of substitution by measuring the absorbance. The relevant equation becomes A=–2.6378×10$^{-3}$+37,390·c. The correlation coefficient (R$^2$) was calculated to be 0.995.

For example, 1.11×10$^{-6}$ mol L$^{-1}$ of b-PEG-CA, exhibited an absorbance of 0.1123 at 313 nm. For 100% attachment of CA the concentration of CA would be 4.44×10$^{-6}$ mol L$^{-1}$. Using the previous equation to solve for the absorbance corresponding to 100% attachment, results in A=0.16337. Therefore, a measured absorbance of 0.1123 corresponds to a degree of substitution of 68.7% according to the formula 0.1123/0.16337·100%.

Figure 10:
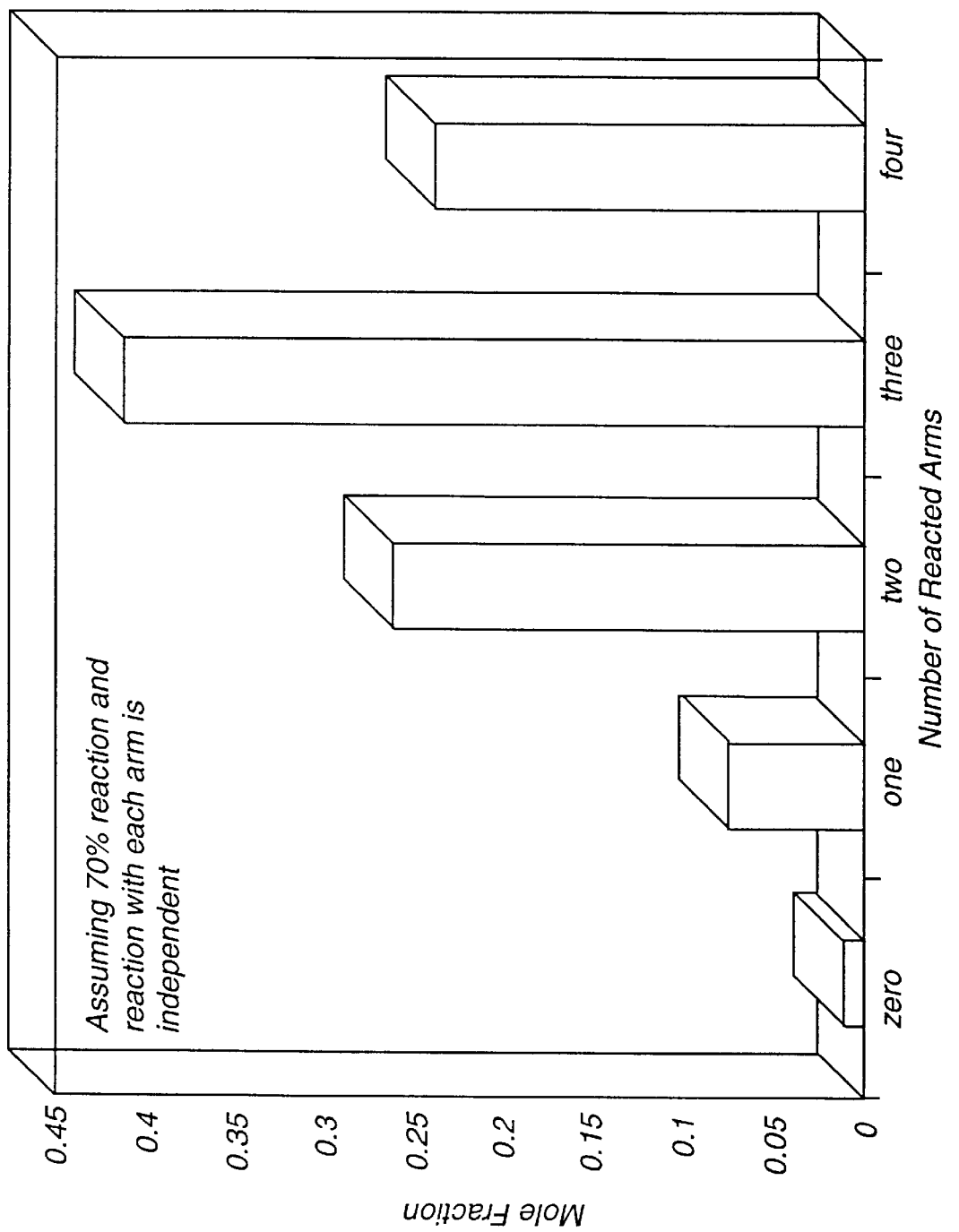
FIG. 10 illustrates the fraction of the esterification PEG product that has zero, one, two, three and four cinnamylidene acetyl groups as determined using a binomial distribution.

Assuming the reactivity of each arm is independent of the status of the other arm, a binomial distribution can be used to estimate the functionality of the esterification product. For example, for a PEG molecule with four arms and an average degree of esterification of 70% (as measured by UV), the resulting product is calculated to comprise 0.8% PEG with no cinnamylidene acetyl group attached, 7.6% with one group attached, 26.5% with two groups attached, 41.2% with three groups attached, and 24% with four groups attached (see FIG. 10).

EXAMPLE 6

Biocompatibility of b-PEG-CA Hydrogels.

The anti-thrombogenic behavior of the b-PEG-CA hydrogels was determined by studying platelet deposition on hydrogel coated glass coverslips perfused with mepacrine-labeled blood. Platelet deposition was measured by using Epifluoresent Video Microscopy. All cover slips were cleaned and spin cast with PMMA. Half of the PMMA slides were spin cast with b-PEG-CA monomers and photopolymerized with a 450 W Hg lamp for approximately 75 minutes. The PMMA slides that had not been coated with b-PEG-CA hydrogels were exposed to UV light for approximately 2 hours and 15 minutes. The uncoated slides served as a control.

Figure 12:
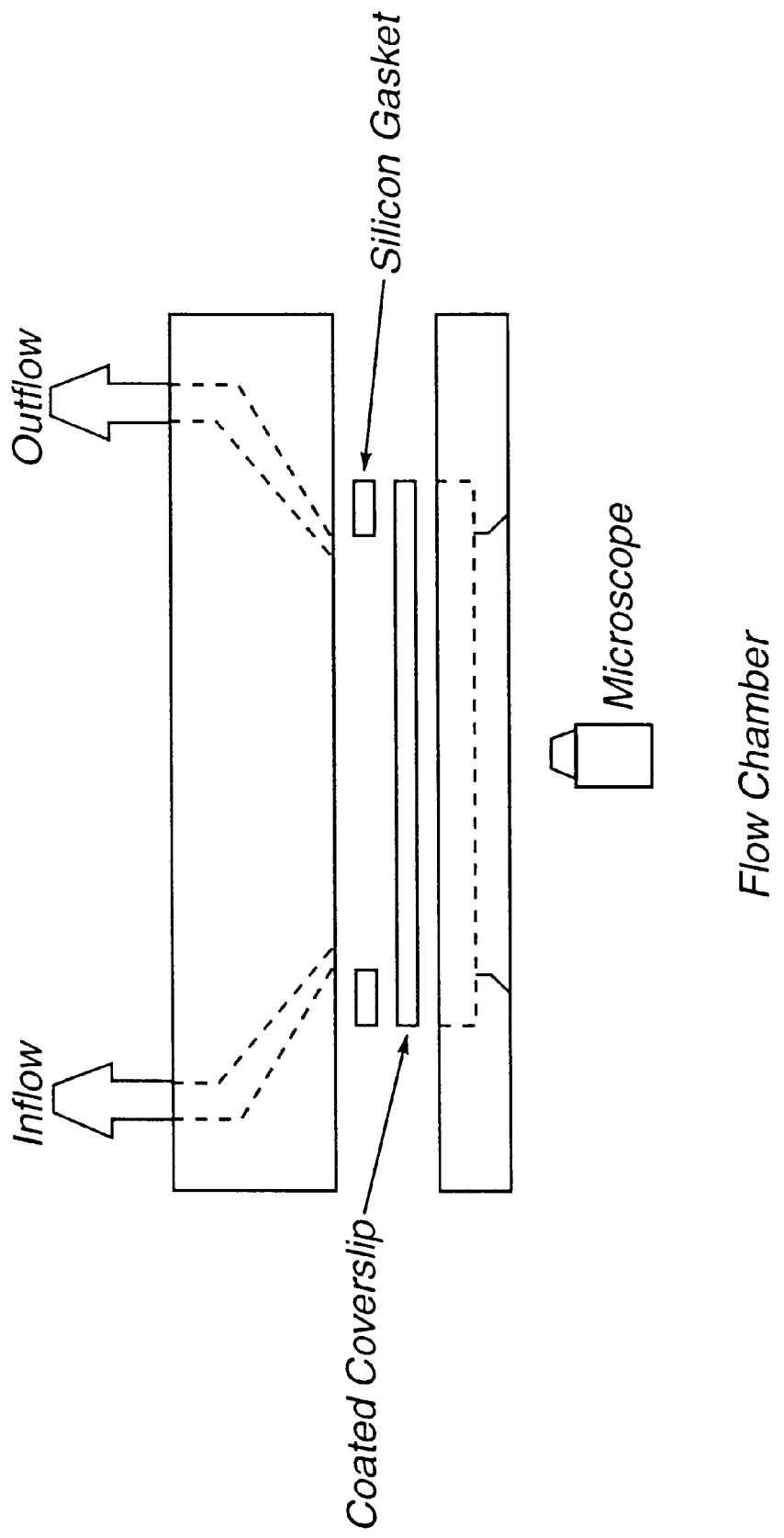
FIG. 12 illustrates a schematic representation of a flow chamber used in the present studies.

Blood was drawn using a 19 gauge needle from the antecubital vein into 4 U/ml Heparin anticoagulant from a healthy nonmedicated volunteer. Heparinized blood was fluorescently labeled with mepacrine. Coverslips were loaded into a flow chamber (see FIG. 12) and the system was filled with Phosphate Buffered Saline. Blood was withdrawn through tubing into the chamber at a wall shear rate of approximately 300 s$^{-1}$. The chamber was placed on a Zeiss Axiovert inverted microscope stage and images were recorded after 7 minutes of perfusion.

Images from the scope were passed through an image intensifier (Hamamatsu) and digitized with a CCD camera (Hamamatsu). Output from the camera was sent to a computer and recorded on a Super VHS videocassete recorder for future image analysis. The image acquisition system has been described in Hubbell, J. A. and McIntire, L. V., *Rev. Sci. Instrum.*, 57, 892–897 (1986). During perfusions, images were gathered by moving the stage to a random spot on the slide and recording approximately 5 seconds of flow to the tape. Fifteen separate random images were obtained for each slide tested. At a later time, recorded perfusions were played back and images were gathered on a computer using a BDS imaging software. Each image collected was an integration of 24 consecutive frames to cancel the effect of platelets moving in the background. For each set of images, the threshold of pixel intensity corresponding to platelet deposition was determined. Images were converted to bitmaps by assigning any pixel above a predetermined threshold a value of 1. The percent surface coverage by platelets was calculated from bitmaps and averaged.

Although the present invention has been described in detail in connection with the above disclosure and examples, it is to be understood that such detail is solely for that purpose and that variations can be made by those skilled in the art without departing from the spirit of the invention except as it may be limited by the following claims.

What is claimed is:

1. A hydrophilic, photosensitive polymer network synthesized from hydrophilic branched macromeric precursors comprising polyethylene glycol, the branches of the branched macromeric precursors being functionalized with a cinnamylidene moiety, the double bonds of the cinnamylidene moieties undergoing intermolecular crosslinking via a 2+2 cycloaddition upon exposure thereof to light of a first known range of wavelengths to form the hydrophilic, photosensitive polymer network, the hydrophilic, photosensitive polymer network being suitable to undergo a reversible photoscission upon exposure thereof to light of a second known range of wavelength.

2. The hydrophilic, photosensitive polymer network of claim 1 wherein each of the branched macromeric precursors comprises no more than 5% cinnamylidene moiety.

3. The hydrophilic, photosensitive polymer network of claim 1 wherein the cinnamylidene moiety is selected from the group consisting of cinnamylidene acetate, α-methylcinnamylidene acetate, α,γ-dimethylcinnamylidene acetate, α-phenylcinnamylidene acetate, α-phenoxycinnamylidene acetate, and cyanocinnamylidene acetate.

4. The hydrophilic, photosensitive polymer network of claim 1 wherein the branched macromeric precursors have a molecular weight of at least 400.

5. The hydrophilic, photosensitive polymer network of claim 1 wherein the branched macromeric precursors comprise biocompatible macromers and the photosensitive polymer network is biocompatible.

6. The hydrophilic, photosensitive polymer network of claim 1 wherein the branched macromeric precursors are functionalized with a cinnamylidene moiety at the terminus of at least three branches thereof.

7. The hydrophilic, photosensitive polymer network of claim 6 wherein the cinnamylidene moiety is selected from the group consisting of cinnamylidene acetate, α-methylcinnamylidene acetate, α,γ-dimethylcinnamylidene acetate, α-phenylcinnamylidene acetate, α-phenoxycinnamylidene acetate, and cyanocinnamylidene acetate.

8. The hydrophilic, photosensitive polymer network of claim 6 wherein the branched macromeric precursors have a molecular weight of at least 400.

9. A method of synthesizing a hydrophilic, photosensitive polymer network comprising the step of crosslinking hydrophilic branched macromeric precursors comprising polyethylene glycol, the branches of the branched macromeric precursors functionalized with a cinnamylidene moiety, the double bonds of the cinnamylidene moieties undergoing intermolecular crosslinking via a 2+2 cycloaddition upon exposure thereof to light of a first known range of wavelengths to form the hydrophilic, photosensitive polymer network, the hydrophilic, photosensitive polymer network being suitable to undergo a reversible photoscission upon exposure thereof to light of a second known range of wavelength.

10. The method of claim 9 wherein each of the branched macromeric precursors comprises no more than 5% cinnamylidene moiety.

11. The method of claim 9 wherein the cinnamylidene moiety is selected from the group consisting of cinnamylidene acetate, α-methylcinnamylidene acetate, α,γ-dimethylcinnamylidene acetate, α-phenylcinnamylidene acetate, α-phenoxycinnamylidene acetate, and cyanocinnamylidene acetate.

12. The method of claim 9 wherein the branched macromeric precursors have a molecular weight of at least 400.

13. The method of claim 9 wherein the branched macromeric precursors comprise biocompatible macromers and the photosensitive polymer network is biocompatible.

14. The method of claim 9 wherein the branched macromeric precursors are functionalized with a cinnamylidene moiety at the terminus of at least three branches thereof.

15. The hydrophilic, photosensitive polymer network of claim 14 wherein the cinnamylidene moiety is selected from the group consisting of cinnamylidene acetate, α-methylcinnamylidene acetate, α,γ-dimethylcinnamylidene acetate, α-phenylcinnamylidene acetate, α-phenoxycinnamylidene acetate, and cyanocinnamylidene acetate.

16. The hydrophilic, photosensitive polymer network of claim 14 wherein the branched macromeric precursors have a molecular weight of at least 400.

* * * * *

UNITED STATES PATENT AND TRADEMARK OFFICE
CERTIFICATE OF CORRECTION

| | | |
|---|---|---|
| PATENT NO. | : 5,990,193 | Page 1 of 1 |
| APPLICATION NO. | : 08/571250 | |
| DATED | : November 23, 1999 | |
| INVENTOR(S) | : Alan J. Russell et al. | |

It is certified that error appears in the above-identified patent and that said Letters Patent is hereby corrected as shown below:

Column 1, line 3, inset the following paragraph.

-- Governmental Interests
This invention was made with government support under grant number BCS9057312 awarded by the National Science Foundation. The government has certain rights in this invention. --

Signed and Sealed this

Fifteenth Day of January, 2008

JON W. DUDAS
*Director of the United States Patent and Trademark Office*